US007015301B2

(12) United States Patent
Albert et al.

(10) Patent No.: US 7,015,301 B2
(45) Date of Patent: Mar. 21, 2006

(54) (ELECTRO)LUMINESCENT POLYMER-ACCEPTOR SYSTEM COMPRISING A POLYMER AND AN ACCEPTOR FOR TRANSFERRING EXCITATION ENERGY

(75) Inventors: Van Dijken Albert, Eindhoven (NL); Klemens Brunner, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 6 days.

(21) Appl. No.: 10/480,079

(22) PCT Filed: Jun. 10, 2002

(86) PCT No.: PCT/IB02/02210

§ 371 (c)(1),
(2), (4) Date: Dec. 8, 2003

(87) PCT Pub. No.: WO02/101846

PCT Pub. Date: Dec. 19, 2002

(65) Prior Publication Data

US 2004/0225106 A1   Nov. 11, 2004

(30) Foreign Application Priority Data

Jun. 12, 2001 (EP) .................................. 01202226

(51) Int. Cl.
*C08G 65/00* (2006.01)
(52) U.S. Cl. ..................... 528/86; 528/373; 528/422; 428/690; 428/917
(58) Field of Classification Search ................. 528/86, 528/373, 422; 428/690, 917
See application file for complete search history.

(56) References Cited

U.S. PATENT DOCUMENTS 5,712,361 A   1/1998  Stern et al. .................. 528/86

FOREIGN PATENT DOCUMENTS

EP   0892028   1/1999
EP   1043382   10/2000

OTHER PUBLICATIONS

Lee C-L et al: "Polymer Phosphorescent Light-emitting devices doped with tris (2-Phenylpyridine) Iridium as a triplet emitter" applied physics letters, American Institute of Physics. NY, US, vol. 77, No. 5, (Oct. 9, 2000), pp. 2280-2282, XP000964144.

Stefano Martina et al; "N-Protected Pyrrole Derivatives Substituted for Metal-Catalyzed Cross-Coupling Reactions", Aug. 1991, pp. 613-615.

EJ.W. List et al.; Excitation energy migration in highly emissive semiconducting polymers, Jul. 21, 2000, pps. 132-138.

*Primary Examiner*—Duc Truong

(57) ABSTRACT

The invention pertains to an (electro)luminescent polymer-acceptor system comprising a polymer with a plurality of chromophores doped with an acceptor for transferring excitation energy from the polymer to the acceptor wherein at least one wavelength of the polymer emission is a wavelength at which the acceptor absorbs energy, and for emitting energy as photons, characterized in that the dwell time of an exciton that is to be transferred from the polymer to the acceptor is longer than the time for transferring said exciton from the polymer to the acceptor, by satisfying the equation $$k_{ET}^{pp} < k_{ET}^{pd},$$

Figure 1:
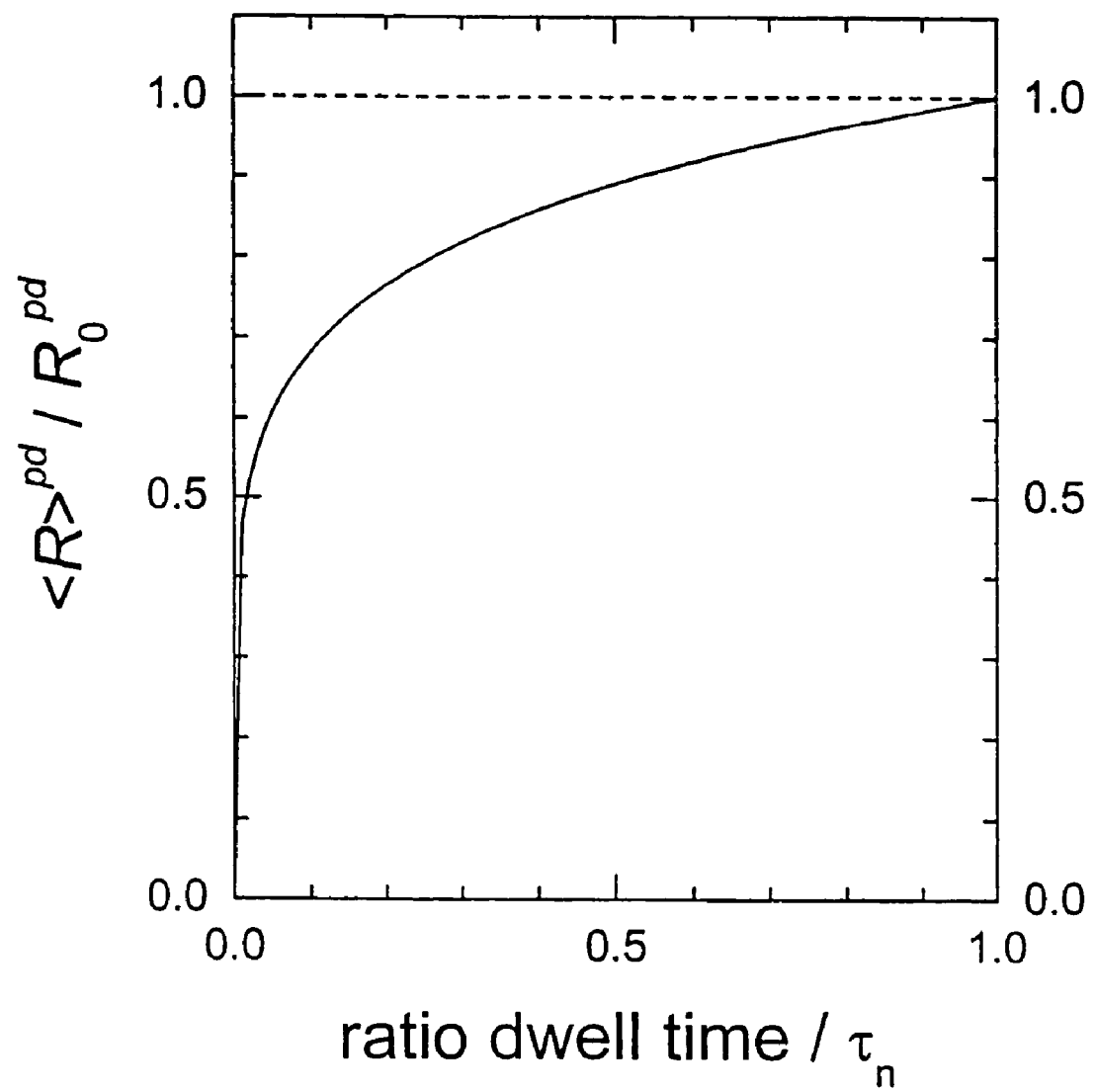

wherein $k_{ET}^{pp}$ is the rate constant of the energy transfer at λ between two chromophores of the polymer, $k_{ET}^{pd}$ is the rate constant of the energy transfer at λ between the polymer and the acceptor. If the energy transfer processes in the polymer-acceptor system can be described by Förster theory the above equation can be rewritten as $$\overline{R}^{pd} < R_0^{pd} \cdot \left(\frac{\tau_{ET}^{pp}}{\tau_n}\right)^{1/6}$$

$\overline{R}^{pd}$ is the mean distance between the polymer and the acceptor, $R_0^{pd}$ is the Förster radius, and $\tau_{ET}^{pp}$ and $\tau_n$ are the experimental lifetimes of a single chromophore and of the plurality of chromophores of the polymer, respectively.

6 Claims, 3 Drawing Sheets

(ELECTRO)LUMINESCENT POLYMER-ACCEPTOR SYSTEM COMPRISING A POLYMER AND AN ACCEPTOR FOR TRANSFERRING EXCITATION ENERGY

The invention pertains to an (electro)luminescent polymer-acceptor system comprising a polymer with a plurality of chromophores and an acceptor for transferring excitation energy, to a method of making such an (electro)luminescent polymer-acceptor system, and to a method for tuning the color in an (electro)luminescent device. (electro)luminescent is short for luminescent and electroluminescent in particular.

In polymer light emitting diodes (PLED) polymeric luminescent substances are used to generate a light. Such devices are known, for instance from EP 1,043,382. In such devices the polymeric material is used as such for emitting light, or the polymer is mixed with other materials, such as organic dyes, in a light emitting layer. A disadvantage of such devices is that for the purpose of obtaining full color emission a large variety of specific luminescent polymers must be made. Such specific polymers are disclosed, for instance, in U.S. Pat. No. 5,712,361. It is known that the luminescence character of such polymers can be changed by mixing the polymer with a luminescent dye, see for instance EP 892,028. However, such mixtures are obtained by trial and error and it is not known in advance which mixtures lead to efficient luminescence. Further, there is no reason that such arbitrary mixtures contribute to the stability of the luminescent system. It is an object of the present invention to find a method for obtaining polymer-acceptor systems with optimum efficiency, stability, color purity, and to find the conditions which such an efficient polymer-acceptor system must satisfy.

The process of excitation energy migration in a polymer doped with a dye is not fully understood. The most pertinent reference in this respect is a publication by List et al., Chemical Physics Letters, 325 (2000), 132–138. These authors come to the conclusion that the excitation energy migration between a polymeric host and guest has to be explained by the sum of at least two processes. First a temperature-dependent migration process of singlet excitons which can be of Dexter or Coulomb type and a second temperature-independent transfer of the singlet exciton, which is of Förster dipole-dipole interaction type. However, these authors do not disclose the requirements that are necessary to obtain optimum luminescent efficiency at maximum stability. Applying the Förster theory, for instance as suggested by List et al, the skilled person comes to the conclusion that maximum overlap of the emission spectrum of the donor and the absorption spectrum of the acceptor is necessary to obtain the highest energy transfer efficiency. However, experiments performed by us unexpectedly showed that this is not the case. On the contrary, under these conditions the efficiency appeared to be very low.

According to the present invention the main issues in polymer luminescent materials, including (electro)luminescent materials, i.e. the stability, efficiency, and the color gamut of the presently known substances, can be addressed by using acceptors in luminescent polymers. The stability is effectively increased by incorporation of an acceptor, which depopulates in a highly efficient manner the (reactive) excited state of the luminescent polymer. When a very stable emissive dye is applied, such as a laser dye, the stability of the material is significantly improved. The second important advantage of the present invention is that luminescent acceptors can be used for the realization of a full color display. According to the invention the dyes are chosen to provide the optimum emission wavelength with respect to the desired color purity. The fact that several emissive acceptors can each be incorporated into a particular polymer for obtaining different emission wavelengths is an additional advantage of the invention. In this way for each of the three basic colors required for a full color display the same device structure can be used.

In the (electro)luminescent polymer-acceptor system of the invention, the acceptor is selected from an organic dye, an oligomer, a polymer, a luminescent nanoparticle, such as a quantum dot, or combinations thereof.

If used in an electroluminescent device the polymer has to be capable of transporting charge carriers, such as holes and/or electrons. Suitably, the polymer may be an, at least partially, conjugated polymer.

The invention therefore pertains to an (electro)luminescent polymer-acceptor system comprising a polymer with a plurality of chromophores doped with an acceptor for transferring excitation energy from the polymer to the acceptor wherein at least one wavelength of the polymer emission is a wavelength □ at which the acceptor absorbs energy, and for emitting energy as photons, characterized in that the dwell time of an exciton that is to be transferred from the polymer to the acceptor is longer than the time for transferring said exciton from the polymer to the acceptor, by satisfying the equation $$k_{ET}^{pp} < k_{ET}^{pd},$$

wherein $k_{ET}^{pp}$ is the rate constant of the energy transfer at λ between two chromophores of the polymer, $k_{ET}^{pd}$ is the rate constant of the energy transfer at λ between the polymer and the acceptor.

If the energy transfer processes of the polymer-acceptor system can be described by Forster theory, the above relationship can be rewritten as $$\overline{R}^{pd} < R_0^{pd} \cdot \left(\frac{\tau_{ET}^{pp}}{\tau_n}\right)^{1/6}$$

wherein $\overline{R}^{pd}$ is the mean distance between the polymer and the acceptor, $R_0^{pd}$ is the Förster radius, and $\tau_{ET}^{pp}$ and $\tau_n$ are the experimental lifetimes of a single chromophore and of the plurality of chromophores of the polymer, respectively. The Förster radius is thereby defined as the separation between a donor and an acceptor for which the rate of energy transfer between the excited donor and the ground state acceptor and the inherent rate of deactivation of the excited donor are equal. The dwell time is the time that an exciton spends on a certain polymeric chromophore. The rate constant of the energy transfer between two chromophores of the polymer is identical to the reciprocal value of the lifetime of the energy transfer at a certain wavelength λ in the polymer.

The ratio $k_{ET}^{pd}:k_{ET}^{pp}$ is preferably greater than 5, more preferably greater than 15, and most preferably greater than 20. For reasons of efficiency, it is preferred that the λ for which the ratio is 1 lies at the high energy side in the area of overlap of the emission spectrum of the polymer and the absorption spectrum of the acceptor, or at an even higher energy. A way to tune the color of a polymer-based (electro)luminescent device is to incorporate luminescent dyes (or more generally luminescent acceptors) into the polymer.

When the dye and the polymer satisfy the above conditions, upon excitation of the polymer the energy will be transferred to the dye, which process is known as excitation energy transfer (EET), followed by luminescence from the dye. By using different dyes, different colors can be obtained. A major advantage of such suitable combinations of polymer and acceptor s is that the emission properties are decoupled from the charge transporting and excitation properties of the polymer. The principle of this invention is based on the known Förster theory for Coulomb dipolar interaction. The standard formulation of this theory is given by the Förster equation:

$$k_{ET} \propto \frac{1}{\tau_D} \cdot \left(\frac{R_0}{R}\right)^6 \tag{1}$$

In this relation $k_{ET}$ is the rate constant for energy transfer, $\tau_D$ the experimental lifetime of the donor in the absence of an acceptor, and R the distance between the donor and the acceptor. $R_0$ is the Förster radius, which for this type of polymer-acceptor systems is approximately 15 Å.

Using Förster's theory the rate constants of the energy transfer between the chromophores, which constitute a disordered polymer (pp transfer) and the energy transfer between a chromophore of the polymer and the acceptor, for instance a dye (pd transfer), is given by:

$$k_{ET}^{pp} \propto \frac{1}{\tau_D^{pp}} \cdot \left(\frac{R_0^{pp}}{\overline{R}^{pp}}\right)^6 \wedge k_{ET}^{pd} \propto \frac{1}{\tau_D^{pd}} \cdot \left(\frac{R_0^{pd}}{\overline{R}^{pd}}\right)^6 \tag{2}$$

wherein $\overline{R}$ is the mean distance between the species involved in the energy transfer process.

The rate for the energy transfer ($\Phi_{ET}$) is:

$$\Phi_{ET} = k_{ET} \cdot [D^*][A] \tag{3}$$

wherein D* stands for the concentration of excited donors and A for the concentration of acceptors. Thus formula (2) can be written as:

$$\Phi_{ET}^{pp} = k_{ET}^{pp} \cdot [p_i^*][p_j] \wedge \Phi_{ET}^{pd} = k_{ET}^{pd} \cdot [p_i^*][d] \tag{4}$$

wherein p and d denote the concentrations of the polymeric chromophores and the dye (acceptor) molecules, respectively. The pd transfer is more efficient than the pp transfer when $\Phi_{ET}^{pp} < \Phi_{ET}^{pd}$, thus:

$$k_{ET}^{pp} < \frac{1}{\tau_n} \cdot \left(\frac{R_0^{pd}}{\overline{R}^{pd}}\right)^{1/6} \tag{5}$$

in which formula d and p are not included as they are constant for all samples. By definition $$k_{ET}^{pp} \equiv \frac{1}{\tau_{ET}^{pp}} \tag{6}$$

Thus formulae (5) and (6) give:

$$\overline{R}^{pd} < R_0^{pd} \cdot \left(\frac{\tau_{ET}^{pp}}{\tau_n}\right)^{1/6} \tag{7}$$

The term $\tau_{ET}^{pp}$ describes the lifetime of the intra-polymer exciton transfer, or in other words, the transfer time of an exciton from chromophore i to chromophore j. This time is also called the dwell time of chromophore i ($\tau_i^{dwell}$). Thus the dwell time is the time that an exciton stays on a certain chromophore.

A disordered polymer can be described as an ensemble (plurality) of chromophores differing in conjugation length and/or chemical surroundings. The dwell time of an exciton on a certain chromophore depends on the excited state energy of this particular chromophore. The dwell time increases when the energy of the excited state decreases. Equation (7) can now be transformed to:

$$\frac{\overline{R}^{pd}}{R_0^{pd}} < \left(\frac{\tau_i^{dwell}}{\tau_n}\right)^{1/6} \tag{8}$$

Since the dwell time cannot be longer than the experimental lifetime $\tau_n$ of the polymer, the above ratio is always smaller than 1. This is shown in FIG. 1 where the mean polymer-dye distance ($<R>^{pd}$) relative to the Förster radius as a function of the ratio between the dwell time and the experimental lifetime of the polymer is given.

The value for the Förster radius ($R_0^{pd}$) can be obtained from the steady state emission spectrum of the undoped polymer and the absorption spectrum of the dye. This value is approximately the same (about 15 Å) for similar systems as described herein. The value of $\tau_n$ can be obtained from time-resolved measurements on the emission from an undoped polymer. $\tau_n$ Is the lifetime of this emission which is dependent on the photon energy and which can vary by two orders of magnitude between high and low energy photons that are emitted from the polymer.

FIG. 1 shows that the energy transfer from the polymer to an acceptor is very inefficient when the dwell time is much shorter than the lifetime of the polymer. Energy transfer from the polymer to the acceptor can only compete with the intra-polymer exciton transfer when the dwell time and transfer time become comparable.

Experimental Procedure

An experimental procedure is described by which one can determine if a polymer-acceptor system satisfies the condition that is described in this description. The term "working" means that under operation a device containing the polymer-acceptor combination emits photons from the acceptor (dopant).

Provided that there is energetic resonance between a polymer and an acceptor (spectral overlap between the polymer emission and the acceptor absorption) excitons will be transferred from the polymer to the acceptor when the dwell time of an exciton on a polymeric chromophore is longer than the transfer time of this exciton to the acceptor. As mentioned before, the dwell time is the time that the exciton spends on a certain polymeric chromophore and this can be determined by measuring the lifetime of the emission originating from the energy level belonging to the particular chromophore. The transfer time between the polymer and the acceptor can be determined by measuring the rise time of the acceptor emission. By comparing the lifetime of the emission from a certain polymer energy level to the rise time of the acceptor emission one can establish whether transfer of an exciton from this particular polymer energy level can occur. A stepwise description of the experimental procedure is:

A polymer-acceptor combination should have a spectral overlap between the polymer emission and the acceptor absorption. First the spectral position of this overlap is determined by measuring the emission spectrum of the pure polymer and the absorption spectrum of the pure acceptor (dopant, dye).

Next it is determined whether the polymer-acceptor combination works because it satisfies the condition which is mentioned in this description: transfer of excitons between a polymer and an acceptor only occurs when the rate constant of transfer of the exciton between two chromophores of the polymer, that is within the polymer, $k_{ET}^{pp}$, is smaller than the transfer rate constant, $k_{ET}^{pd}$, of this exciton from the polymer to the acceptor, i.e. $k_{ET}^{pp} < k_{ET}^{pd}$.

As mentioned above, the $k_{ET}^{pp}$ at a particular wavelength of emission is determined by measuring the lifetime at that wavelength of the polymer as such, that is without the acceptor being present, lifetime being defined as the time at which the intensity has dropped to 1/e the maximum (initial) intensity. Such rate constants are measured over the entire range of spectral overlap as any of the polymer energy levels in this range could be involved in the transfer process. These measurements are done with an order of magnitude accuracy.

Finally, the transfer rate constant $k_{ET}^{pd}$, which is a property of the combined polymer-acceptor system, is determined by measuring the rise time at a wavelength at which only the emission originating from the acceptor is observed, the rise time being measured with a similar (order of magnitude) accuracy, rise time being defined as the time at which the intensity has risen to 1/e its maximum intensity.

If anywhere in the spectral overlap region the lifetime of the polymer emission is longer than the rise time of the acceptor emission, the polymer-acceptor combination satisfies the condition mentioned in this invention.

Thus the invention also pertains to a method of making a polymer-acceptor system comprising the steps of selecting a polymer and an acceptor, such that at least one wavelength of the emission spectrum of the polymer overlaps with at least one wavelength of the absorption spectrum of the acceptor, and whereby the dwell time of an exciton that is to be transferred from the polymer to the acceptor is longer than the time for transferring said exciton from the polymer to the acceptor, after which said selected polymer doped with said selected acceptor is applied in an (electro)luminescent device.

In another aspect, the invention also provides a method for tuning the color in an (electro)luminescent device by using an (electro)luminescent polymer-acceptor system for transferring excitation energy from a polymer to an acceptor wherein at least one wavelength of the polymer emission overlaps with a wavelength at which the acceptor absorbs energy, and for emitting energy as photons whereby the dwell time of an exciton that is to be transferred from the polymer to the acceptor is longer than the time for transferring said exciton from the polymer to the acceptor, characterized in that at least two polymers with a plurality of chromophores are used, which polymers can be the same or different, and at least one of the polymers is doped with an acceptor to form a combination therewith, each of the polymer and acceptor combinations satisfying the equations $k_{ET}^{pp} < k_{ET}^{pd}$, and $$\overline{R}^{pd} < R_0^{pd} \cdot \left( \frac{\tau_{ET}^{pp}}{\tau_n} \right)^{1/6}$$

wherein $k_{ET}^{pp}$ is the rate constant of the energy transfer at $\lambda$ between two chromophores of the polymer, $k_{ET}^{pd}$ is the rate constant of the energy transfer at $\lambda$ between the polymer and the acceptor, $\overline{R}^{pd}$ is the mean distance between the polymer and said acceptor, $R_0^{pd}$ is the Förster radius, and $\tau_{ET}^{pp}$ and $\tau_n$ are the experimental lifetimes of a single chromophore and of the plurality of chromophores of the polymer, respectively.

The polymer-acceptor system of the invention can be used in polymer light emitting diodes (LED), polymer light emitting cells (LEC), displays in general, and in plastic electronics (such as field effect transistors).

The invention is illustrated by means of the following non-restrictive example.

EXAMPLE 1

The polymer poly (2-(meta-3,7 dimethyloctyloxy-phenyl)-p-phenylene vinylene, which is a green emitting polymer with a repeating unit of the structural formula:

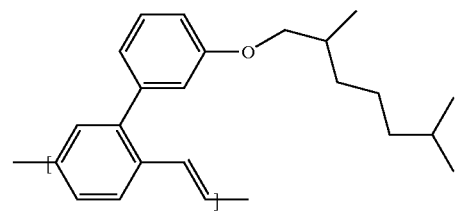

and the red emitting organic dye acceptor (dopant), 4,4-difluoro-3,5-bis[2-(5-methylthiophene)]-4-bora-3a,4a-diaza-s-indacene, with the structural formula:

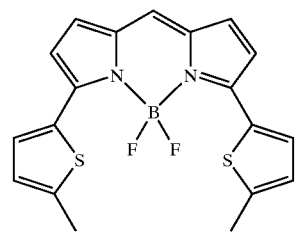

were used for making the polymer-acceptor system of the invention.

First, a solution of the polymer was prepared by dissolving a specific amount of the polymer in toluene to yield a solution which contains 4 g polymer per 1 l of toluene (0.4% weight-to-volume ratio). This solution was stirred overnight at room temperature. Secondly, a small amount of the dye was dissolved in toluene. The concentration of this dye solution was chosen such that only a few µl had to be added to about 5 ml of the polymer solution to give a 0.75% dye-to-polymer weight ratio. The dye-polymer solution was spin coated onto a glass substrate giving a layer thickness of about 70 nm.

Figure 2:
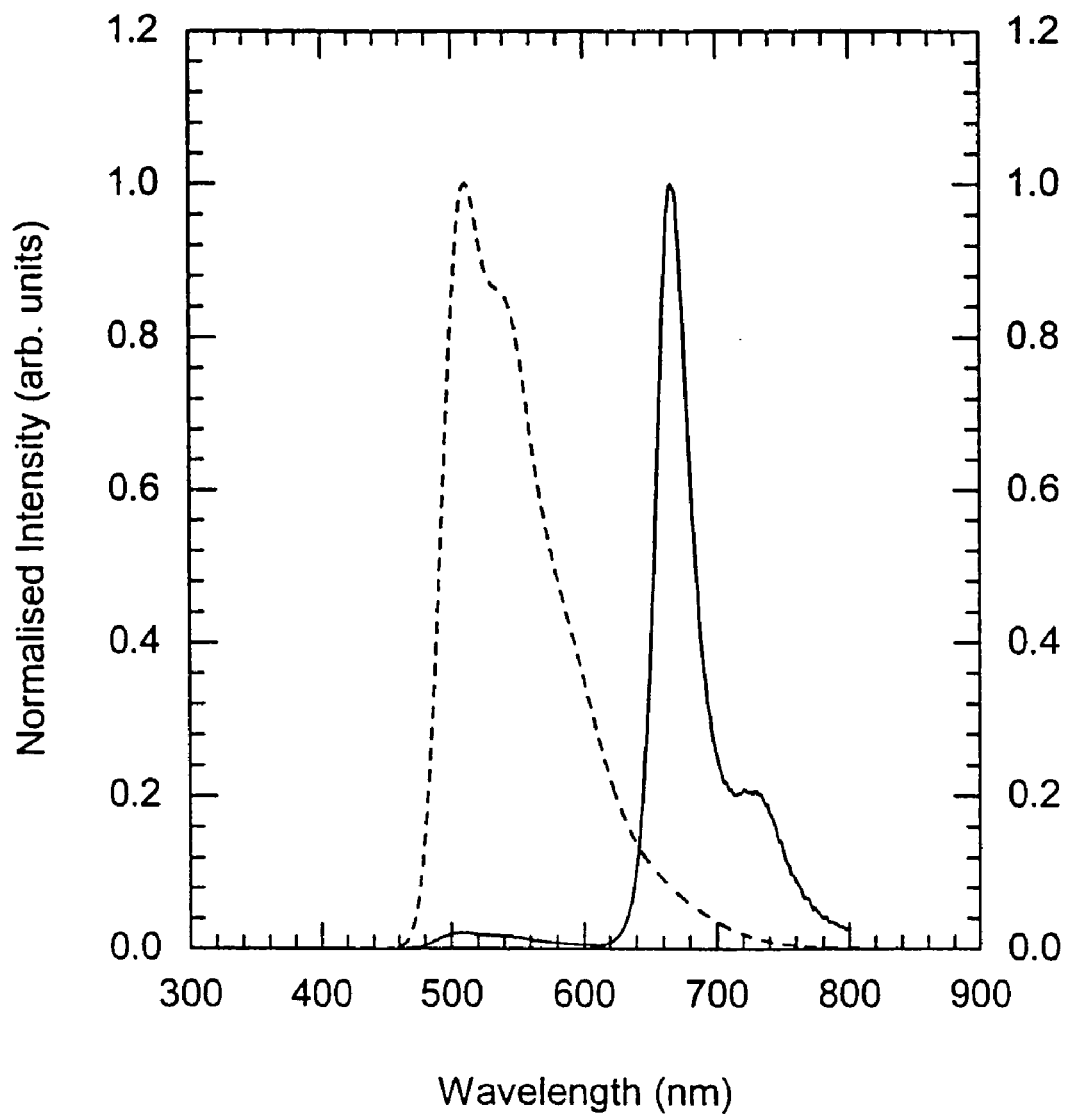

Photoluminescence emission spectra of the undoped green emitting polymer (dashed line) and of the same polymer doped with the red emitting organic dye (full line) upon excitation with light of 410 nm are shown in FIG. 2. The photoluminescence excitation spectra as recorded at the maximum of the emission band were identical for both samples indicating that only the polymer is photoexcited and that the emission from the dye is due to energy transfer from the polymer to the dye. From FIG. 2 it can also be seen that in the dye-doped polymer still a remainder of the polymer emission is visible. If this remaining emission band is compared to the original emission band it is clear that the former is shifted to higher energies with respect to the latter. This means that in the dye-doped polymer, the polymeric chromophores with a relatively high HOMO-LUMO distance are still emitting, although an energy acceptor is present. Apparently, only the polymeric chromophores with a lower HOMO-LUMO distance are transferring their energy to the organic dye because the dwell time of the exciton on these chromophores is long enough to enable transfer of the exciton to the organic dye.

Figure 3:
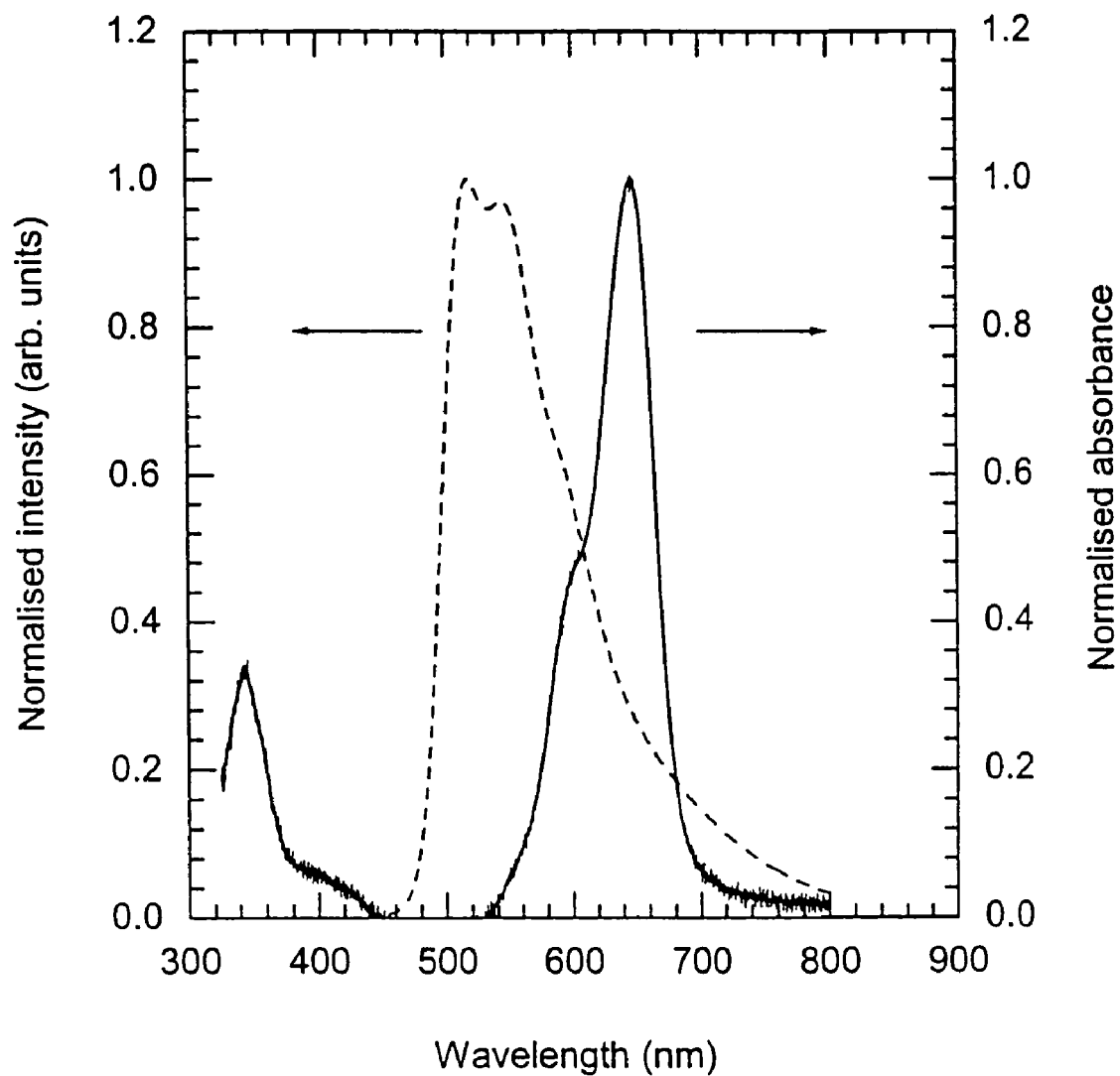

As can be seen in FIG. 3, the absorption spectrum of the red emitting organic dye overlaps the emission spectrum of the green emitting polymer (dashed line) at its low energy side. This is in agreement with the observations made from FIG. 2. The only polymeric chromophores that are capable of transferring energy to the organic dye are situated at the low-energy side of the polymer emission band, which is at the same point where the organic dye has its highest absorbance.

Synthesis of 4,4-difluoro-3,5-bis[2-(5-methylthiophene)]-4-bora-3a,4a-diaza-s-indacene -bromosuccinimide (9.08 g) was added to a mixture of 20-methylthiophene (5.00 g) in 25 ml of THF (tetrahydrofuran) at 0° C. The mixture was kept in the dark and stirred overnight. The solvent was evaporated, the precipitate was dissolved in 30 ml of diethyl ether, and washed with a saturated sodium hydrogencarbonate solution. The organic solution was dried over magnesium sulfate, filtered, and concentrated to give a crude oily product, which was purified with vacuum distillation to give a colorless oil (5-bromo-2-methylthiophene) in 82% yield.

mixture of 6-bromo-2-naphthol (10.0 g), 3-bromopropanol (9.4 g) and potassium hydroxide (3.0 g) in 50 ml of ethanol was refluxed for 16 h. The mixture was washed with diethyl ether and water. The combined organic layers were dried, filtered, and concentrated. The crude product was crystallized from ethanol to give 6-bromo-2-(3-hydroxypropyloxy)-naphthalene in 40% yield.

o N-tert-butoxycarbonyl-2-trimethylstannylpyrrole (2.0 g; prepared according to S. Martina et al., *Synthesis*, 1991, 613) and 5-bromo-2-methylthiophene (1.07 g) in 20 ml DMF (N,N-dimethylformamide) was added dichloro bis(triphenylphosphino)palladium(II) (87 mg) under an argon atmosphere. The mixture was heated at 70° C. for 16 h. After cooling the mixture was washed with diethyl ether and water. The combined organic layers were dried (MgSO$_4$), filtered, and concentrated. The crude product was purified by column chromatography (silica, hexane/dichloromethane, 66/34,v/v) to give a pure yellow oil in 32% yield [2-(2-(5-methylthiophene)-N-tert-butoxycarbonylpyrrole].

To N-tert-butoxycarbonyl-2-trimethylstannylpyrrole (3.0 g) and 6-bromo-2-(3-hydroxypropyloxy)naphthalene (2.55 g) in 20 ml of DMF was added dichloro bis(triphenylphosphino)palladium(II) (64 mg) under an argon atmosphere. The mixture was heated at 70° C. for 16 h. After cooling the mixture was washed with diethyl ether and water. The combined organic layers were dried (MgSO$_4$), filtered, and concentrated. The crude product was purified by column chromatography (silica, hexane/dichloromethane, 2/98, v/v) to give a pure oil in 60% yield [2-(6-(3-hydroxypropyloxy)-naphthyl)-N-tert-butoxycarbonylpyrrole]. To this oil (0.5 g) in 10 ml of DMF was added dropwise phophorusoxychloride (0.42 g) at 0° C. under an argon atmosphere. The mixture was heated at 60° C. for 2 h. After cooling the mixture was neutralized with aqueous sodium hydroxide (1 M) and heated at 80° C. for 1 h. After cooling the precipitate was filtered off and purified by column chromatography (silica, methanol/dichloromethane, 1/99,v/v) to give a 75% yield of 5-formyl-2-(6-(3-chloropropyloxy)-naphthyl)-N—H-pyrrole.

2-(2-(5-methylthiophene)-N-tert-butoxycarbonylpyrrole (0.50 g) was converted to 2-(2-(5-methylthiophene)-N—H-pyrrole by heating at 190° C. for 15 min in an argon atmosphere. After cooling to room temperature dichloromethane (40 ml) and 5-formyl-2-(6-(3-chloropropyloxy)-naphthyl)-N—H-pyrrole (0.60 g) were added.

Phosphorusoxychloride (180 µl) was added dropwise. After stirring at room temperature for 16 h, N,N-diisopropylethylamine (1.35 ml) and boron trifluoride diethyl etherate (1.0 ml) were added and the mixture was stirred for another 2 h. The reaction mixture was washed with brine, dried, filtered, concentrated, and purified by column chromatography (silica; hexane/chloroform 40/60 v/v) giving 14% yield of 4,4-difluoro-3,5-bis[2-(5-methylthiophene)]-4-bora-3a,4a-diaza-s-indacene.

Characteristic $^1$H-NMR (CDCl$_3$) signals (ppm) are: 7.98 (d, 2H, J=3.8 Hz); 7.01 (s, 1H); 6.96 (d, J=4.2 Hz, 2H); 6.85 (dd, J=3.8 Hz, 2H); 6.74 (d, 2H, J=4.2 Hz); 2.55 (s, 6H).

Synthesis of poly(2-(meta-3.7 dimethyloctyloxy-phenyl)-p-phenylene vinylene

In a dry threeneck flask a solution of 2,5-bis(chloromethyl)-1(meta-3,7dimethyloctyloxyl-phenyl) benzene (15.03 gr, 3.69 10$^{-2}$ mol) in 2 liters of dry dioxane (distilled) was degassed for 1 hour by passing through a continuous stream of nitrogen and heated to 100° C. The base (24.76 gram, 0.22 mol, 6 eq.) was added in two portions dissolved in dry and degassed dioxane (2 times 150 ml). The solution was heated for two hours at 100° C. A small amount (20 ml) of acetic acid was added to quench the base. The colour changes from green to fluorescent green/yellow. The solution is precipated in water. After filtration the raw polymer is dissolved in THF by heating for 2 hours at 60° C. and precipitated in methanol. This procedure is repeated. The polymer is dried in vacuo and the yield is 8 grams of polymer (65%) in yellow fibers.

The following characteristics apply:

GPC: against polystyrene standards UV detection M$_n$=3.0 10$^5$ g/mol Mw =1,5 10$^5$ g/mol. PL$\lambda_{max}$=525 nm $^1$H-NMR (CDCl$_3$) δ(ppm)=7.9–6.8 (br. M, 9H), 4.2–3.9 (br. M, 2H) 2.0–1.0 (br, m., 13H) 0.9 (s, 6H)

The invention claimed is:

1. An (electro)luminescent polymer-acceptor system comprising a polymer with a plurality of chromophores doped with an acceptor for transferring excitation energy from the polymer to the acceptor wherein at least one wavelength of the polymer emission is a wavelength λ at which the acceptor absorbs energy, and for emitting energy as photons, characterized in that the dwell time of an exciton that is to be transferred from the polymer to the acceptor is longer than the time for transferring said exciton from the polymer to the acceptor, by satisfying the equation $$K_{ET}^{pp} < K_{ET}^{pd},$$

wherein $K_{ET}^{pp}$ is the rate constant at λ of the energy transfer between two chromophores of the polymer, $K_{ET}^{pd}$ is the rate constant at λ of the energy transfer between the polymer and the acceptor.

2. The (electro)luminescent polymer-acceptor system of claim 1 wherein the polymer comprises a substituted or unsubstituted phenylene-vinylene, phenylene, phenylene-ethyne, triphenylamine, thiophene, vinylcarbazole, fluorene, or a spirofluorene.

3. The (electro)luminescent polymer-acceptor system of claim 1 wherein the polymer is chemically bonded to the acceptor through a spacer.

4. A method of making a polymer-acceptor system comprising the steps of selecting a polymer and an acceptor, such that at least one wavelength of the emission spectrum of the polymer overlaps with at least one wavelength of the absorption spectrum of the acceptor, and whereby the dwell time of an exciton that is to be transferred from the polymer to the acceptor is longer than the time for transferring said exciton from the polymer to the acceptor, after which said selected polymer is doped with said selected acceptor and applied in an (electro)luminescent device.

5. A method for tuning the color in an (electro) luminescent device by using an (electro)luminescent polymer-acceptor system for transferring excitation energy from a polymer to an acceptor wherein at least one wavelength of the polymer emission overlaps with a wavelength λ at which the acceptor absorbs energy, and for emitting energy as photons whereby the dwell time of an exciton that is to be transferred from the polymer to the acceptor is longer than the time for transferring said exciton from the polymer to the acceptor, characterized in that at least two polymers with a plurality of chromophores are used, which polymers can be the same or different, and at least one of the polymers is doped with an acceptor to form a combination therewith, each of the polymer and acceptor combinations satisfying the equations $$K_{ET}^{pp} < K_{ET}^{pd},$$

wherein $K_{ET}^{pp}$ is the rate constant of the energy transfer at λ between two chromophores of the polymer, $K_{ET}^{pd}$ is the rate constant of the energy transfer at λ between the polymer and the acceptor.

6. The method of claim 5 wherein three polymers with a plurality of chromophores are used, which polymers can be the same or different, and wherein at least two of the polymers are doped with a different acceptor to form a combination therewith.

* * * * *